(12) United States Patent
Boni et al.

(10) Patent No.: US 12,222,492 B2
(45) Date of Patent: Feb. 11, 2025

(54) MICROELECTROMECHANICAL DEVICE HAVING A STRUCTURE TILTABLE BY PIEZOELECTRIC ACTUATION ABOUT TWO ROTATION AXES

(71) Applicant: STMicroelectronics S.r.l., Agrate Brianza (IT)

(72) Inventors: Nicolo' Boni, Albino (IT); Roberto Carminati, Piancogno (IT); Massimiliano Merli, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 775 days.

(21) Appl. No.: 17/487,166

(22) Filed: Sep. 28, 2021

(65) Prior Publication Data

US 2022/0099960 A1    Mar. 31, 2022

(30) Foreign Application Priority Data

Sep. 29, 2020 (IT) .......................... 102020000022978

(51) Int. Cl.
*G02B 26/08* (2006.01)
*B81B 3/00* (2006.01)

(52) U.S. Cl.
CPC ........ *G02B 26/0858* (2013.01); *B81B 3/0062* (2013.01); *B81B 2201/042* (2013.01)

(58) Field of Classification Search
None
See application file for complete search history.

(56) References Cited

U.S. PATENT DOCUMENTS

2012/0320441 A1\* 12/2012 Kann ................ G02B 26/0841
359/224.1

FOREIGN PATENT DOCUMENTS

EP          3712676 A1    9/2020
KR     20190017494 A      2/2019

OTHER PUBLICATIONS

IT Search Report and Written Opinion for IT Appl. No. 102020000022978 dated May 18, 2021 (9 pages).

\* cited by examiner

*Primary Examiner* — Jennifer D. Carruth
(74) *Attorney, Agent, or Firm* — Crowe & Dunlevy LLC (57) ABSTRACT

A microelectromechanical device includes a fixed structure having a frame defining a cavity, a tiltable structure elastically suspended above the cavity with main extension in a horizontal plane, a piezoelectrically driven actuation structure which can be biased to cause a desired rotation of the tiltable structure about a first and second rotation axes, and a supporting structure integral with the fixed structure and extending in the cavity starting from the frame. Lever elements are elastically coupled to the tiltable structure at a first end by elastic suspension elements and to the supporting structure at a second end by elastic connecting elements which define a lever rotation axis. The lever elements are elastically coupled to the actuation structure so that their biasing causes the desired rotation of the tiltable structure about the first and second rotation axes.

20 Claims, 6 Drawing Sheets

MICROELECTROMECHANICAL DEVICE HAVING A STRUCTURE TILTABLE BY PIEZOELECTRIC ACTUATION ABOUT TWO ROTATION AXES

PRIORITY CLAIM

This application claims the priority benefit of Italian Application for Patent No. 102020000022978, filed on Sep. 29, 2020, the content of which is hereby incorporated by reference in its entirety to the maximum extent allowable by law.

TECHNICAL FIELD

This disclosure relates to a microelectromechanical device (made with MEMS—MicroElectroMechanical System—technology) having a structure tiltable by piezoelectric actuation about two rotation axes.

BACKGROUND

Reference will be made hereinafter, without this implying any loss of generality, to a microelectromechanical mirror device, where the tiltable structure carries, on a top surface thereof, a reflecting, or mirror, surface.

In a known manner, microelectromechanical mirror devices, in particular of the vector-scanner type (the so-called MEMS vector scanners), are used in portable apparatuses, such as, for example, smartphones or tablets, for projecting images at a distance, and in three-dimensional (3D) sensing applications, for increasing the field of view (FOV) and the resolution of projection or for creating desired patterns. Thanks to the reduced dimensions, these devices allow meeting of stringent requirements regarding occupation of space, in terms of area and thickness.

These microelectromechanical mirror devices generally include a mirror structure, which is made starting from a body of semiconductor material and is elastically supported above a cavity so as to be movable, for example with a movement of inclination or rotation out of a corresponding plane of main extension, for directing an incident light beam in a desired manner.

Typically, a deflection of the incident light beam along two axes is desired, which can be obtained by a single microelectromechanical mirror device of a biaxial type, i.e., one in which the mirror structure is tiltable about two rotation axes.

Figure 1A:
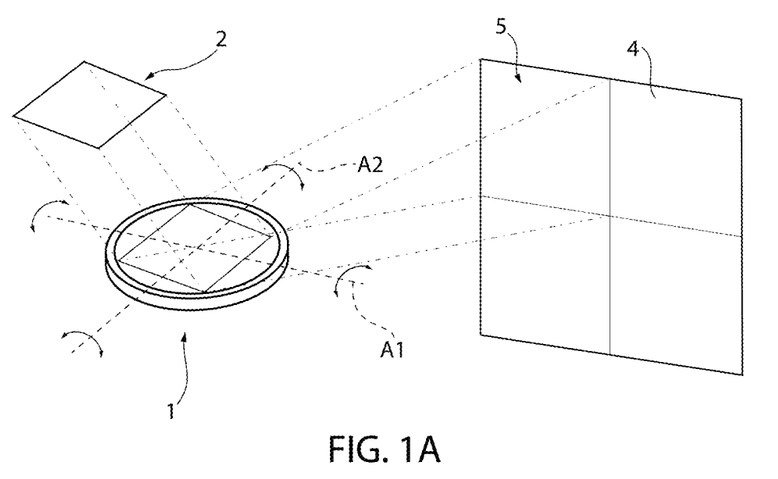
FIGS. 1A-1B are schematic depictions of possible uses of a mirror system of a known type.

FIG. 1A schematically shows a mirror structure 1, of a vector-scanner type, which projects at a distance an incident image (or pattern of dots) 2 toward a screen 4.

The mirror structure 1 can be driven so as to carry out rotations about a first rotation axis and a second rotation axis, designated by A1 and A2, respectively, in particular assuming, according to the aforesaid rotations, four different quasi-static positions so as to direct the incident light beam 2 onto a projection area 5 on the screen 4. Advantageously, said projection area 5 is four times larger than the area defined by the incident light beam 2, consequently providing a projection with a resolution that is four times higher and a field of view that is also four times larger compared to the characteristics of the aforesaid incident light beam 2.

Figure 1B:
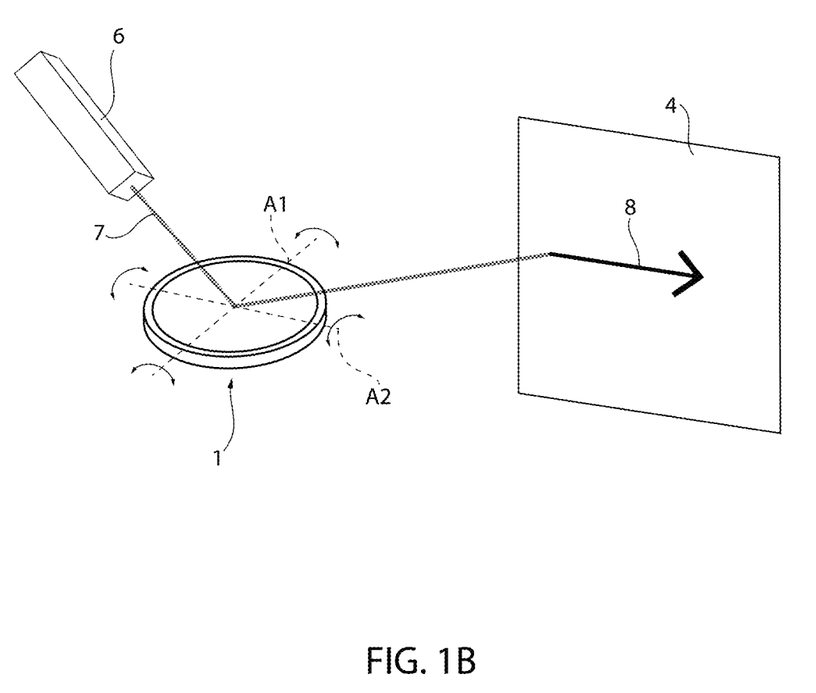

FIG. 1B shows a further use of the mirror structure 1, in this case for generating on the screen 4 simple patterns 8, for example arrows, as in the case illustrated, indications, wordings with few letters or the like, by reflection of an incident beam 7 generated by a laser source 6. The mirror structure 1 can once again be driven in rotation about the first and second rotation axes A1 and A2, in this case by performing quasi-static linear movements so as to generate the desired patterns 8 on the screen 4.

The majority of known microelectromechanical mirror devices envisage an actuation of an electrostatic or electromagnetic type for implementing rotation of the mirror structure. Electrostatic-actuation systems generally use high operating voltages, whereas electromagnetic-actuation systems in general entail high power consumption.

Approaches based on a piezoelectric actuation have therefore been proposed, in particular by actuators made of PZT (lead zirconate titanate), and moreover based on detection of the extent of movement of the mirror structure by piezoresistive (PZR) sensor elements. Piezoelectric-actuation mirror devices in general have the advantage of using actuation voltages and power-consumption levels lower than electrostatic or electromagnetic actuation devices.

For example, United States Patent Application Publication No. 2020/0192199 (corresponding to European Patent No. 3,666,727 A1), the contents of which are hereby incorporated by reference, discloses a microelectromechanical structure provided with a structure tiltable by piezoelectric actuation having improved mechanical and electrical characteristics.

The above microelectromechanical structure comprises: a fixed structure defining a cavity; a tiltable structure, which is elastically suspended in the cavity and has a main extension in a horizontal plane; a piezoelectrically-driven actuation structure which can be biased for causing a rotation of the tiltable structure about at least a first rotation axis parallel to a first horizontal axis of the horizontal plane, the actuation structure being interposed between the tiltable structure and the fixed structure. In particular, the actuation structure comprises at least a first pair of driving arms, which carry respective piezoelectric material regions and are elastically coupled to the tiltable structure on opposite sides of the first rotation axis, by respective elastic decoupling elements, which are rigid to movements out of the horizontal plane and compliant to torsion about the first rotation axis.

The aforesaid microelectromechanical mirror structure is configured to rotate about the first horizontal axis with a resonant movement in order to generate a fast horizontal scan; as described in the referenced document, the tiltable structure may moreover be driven about a second horizontal axis with a linear or quasi-static movement (i.e., at a frequency much lower than the frequency of the resonant movement) so as to generate a slow vertical scan, for example of a sawtooth type.

Even though the structure described in the aforesaid document has several advantageous features, it is not designed for use in microelectromechanical mirror devices of the vector-scanner type (the so-called MEMS Vector Scanners), where, as mentioned previously, the mirror structure is tiltable so as to assume four different quasi-static positions.

There is a need in the art to provide a microelectromechanical device with actuation of a piezoelectric type that will allow overcoming of the drawbacks of the prior art described above.

SUMMARY

Disclosed herein is a microelectromechanical device, including: a fixed structure having a frame defining a cavity; a tiltable structure elastically suspended above the cavity and having a main extension in a horizontal plane; a piezoelectrically driven actuation structure, configured to be biased to cause a desired rotation of the tiltable structure about a first rotation axis and a second rotation axis in the horizontal plane; a supporting structure integral with the fixed structure and extending into the cavity starting from the frame; and lever elements, elastically coupled to the tiltable structure at a first end by respective elastic suspension elements and coupled to the supporting structure at a second end by elastic connecting elements which define a lever rotation axis. The lever elements are elastically coupled to the piezoelectrically driven actuation structure so that biasing of the piezoelectrically driven actuation structure causes, as a result of rotation of the lever elements about the lever rotation axis, the desired rotation of the tiltable structure about the first rotation axis and the second rotation axis.

The piezoelectrically driven actuation structure may include, for each of the lever elements, a first pair of driving arms, elastically coupled to the lever element by first elastic driving elements, and a second pair of driving arms, elastically coupled to the lever element by second elastic driving elements on an opposite side of the lever rotation axis with respect to the first elastic driving elements.

The first and second elastic driving elements may be rigid with respect to movements out of the horizontal plane, along a vertical axis orthogonal to the horizontal plane, and compliant to torsion.

The first and second pair of driving arms may be suspended in cantilever fashion above the cavity, with a first end integrally coupled to the supporting structure and a second end elastically coupled to the lever elements. The driving arms may carry, on a top surface thereof opposite to the cavity, a respective piezoelectric material region.

The supporting structure may include: first arms, which extend starting from the frame towards the tiltable structure; and second arms, having a first end elastically coupled to a respective lever element by a respective elastic connecting element and having a second end integral with a respective one of the first arms; wherein the driving arms of the first pair of driving arms are arranged externally to the second arms, between the second arms and the frame, and the driving arms of the second pair of driving arms are arranged internally to the second arms, between the second arms and a corresponding lever element.

The microelectromechanical device may have central symmetry with respect to a center; wherein the first rotation axis is a first axis of symmetry and the second rotation axis is a second axis of symmetry, the microelectromechanical device being consequently divided into four quadrants with respect to the center.

The driving arms of the first pair of driving arms in a given quadrant may be biased in a manner corresponding to the driving arms of the second pair of driving arms in the quadrant arranged symmetrically with respect to the center, and the driving arms of the second pair of driving arms in the given quadrant may be biased in a manner corresponding to the driving arms of the first pair of driving arms in the quadrant arranged symmetrically with respect to the center. The driving arms of the first and second pairs of driving arms may define four sets of driving electrodes designed to be biased to jointly define desired rotations of the tiltable structure about the first and second rotation axes.

The four sets of driving electrodes may be designed to be biased to define four different rotations of the tiltable structure and four corresponding quasi-static driving positions.

The tiltable structure may carry, at its top, a mirror surface, the microelectromechanical device providing a two-dimensional vector-scanner mirror device.

The driving arms of the first pairs of driving arms in each quadrant may be biased in a corresponding manner, and the driving arms of the second pairs of driving arms in each quadrant may be biased in a respective corresponding manner. The driving arms of the first and second pairs of driving arms may be designed to be biased to define linear movements of the tiltable structure along a vertical axis, orthogonal to the horizontal plane.

The microelectromechanical device may provide an actuator for a speaker device.

The elastic suspension elements may be rigid to movements out of the horizontal plane, along a vertical axis orthogonal to the horizontal plane, and may be furthermore configured to enable a relative rotation between the tiltable structure and the lever elements.

Each of the elastic suspension elements may include a first folded portion connected to an edge portion of the tiltable structure, and a second torsional portion connected between the first portion and the first end of a respective lever element.

The tiltable structure may be coupled to a base portion, formed at a same level as the piezoelectrically driven actuation structure and the supporting structure, by a connection pillar having extension along a vertical axis orthogonal to the horizontal plane.

The first and second rotation axes may be parallel to the first and second horizontal axes.

The first and second rotation axes may be inclined at 45° with respect to the first and second horizontal axes.

The elastic connecting elements may be torsional elastic connecting elements.

BRIEF DESCRIPTION OF THE DRAWINGS

For a better understanding, embodiments are now described, purely by way of non-limiting example, with reference to the attached drawings, wherein.

DETAILED DESCRIPTION

Figure 2:
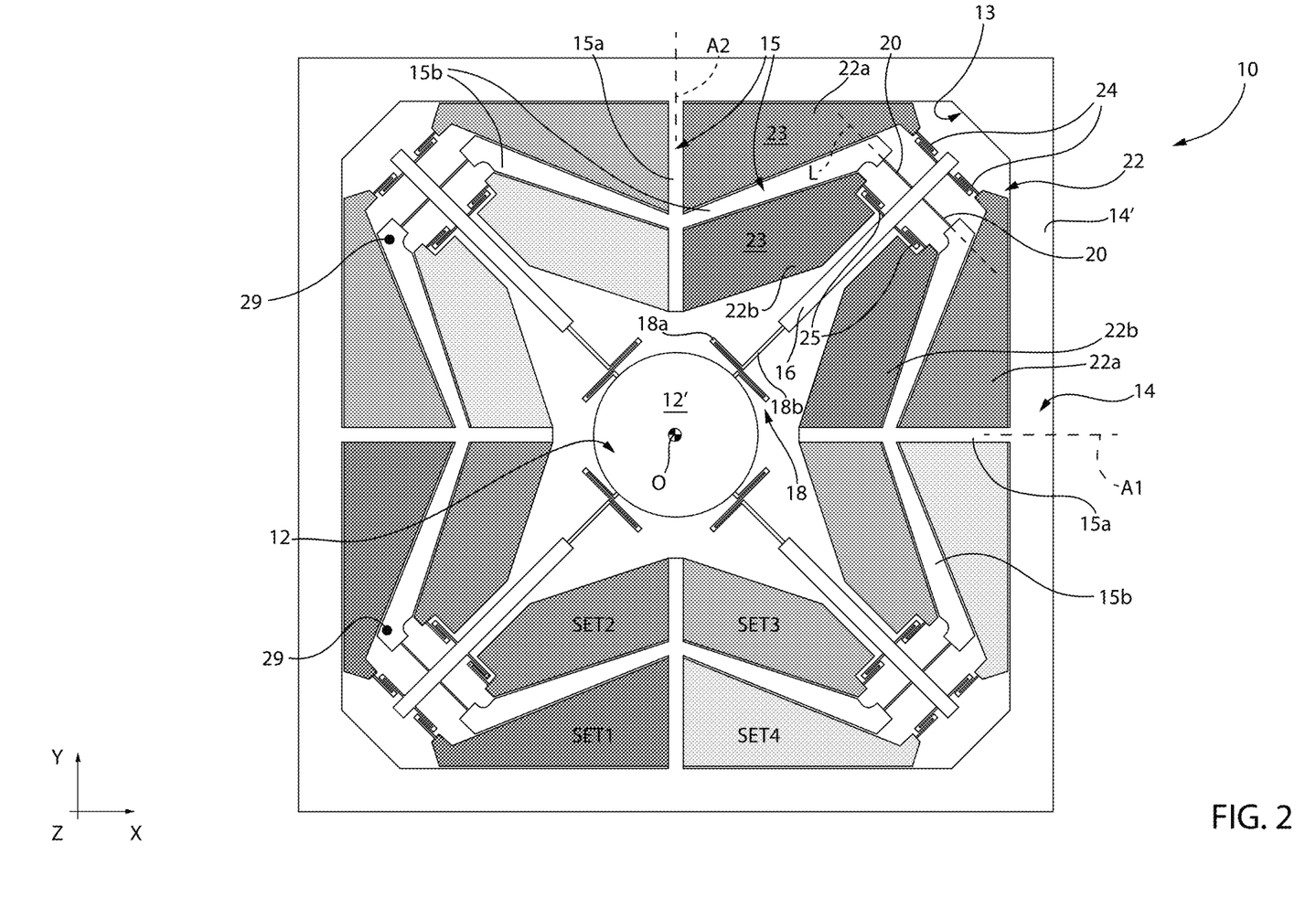
FIG. 2 is a top view of a microelectromechanical device according to a first embodiment described herein.

FIG. 2 is a schematic depiction of a MEMS (MicroElectroMechanical System) device 10, in particular a mirror device of the vector-scanner type, according to a first embodiment.

The microelectromechanical device 10 is formed in a die of semiconductor material, in particular silicon, and is provided with a tiltable structure 12. The tiltable structure has a main extension in a horizontal plane XY and can be driven so as to rotate about a first rotation axis A1, which is parallel to a first horizontal axis X of the aforesaid horizontal plane XY, and about a second rotation axis A2, which is parallel to a second horizontal axis Y of the horizontal plane XY and defines, with the first horizontal axis X, the aforesaid horizontal plane XY (in the embodiment illustrated, the sides of the die are moreover parallel to the horizontal axes x, y).

As will be discussed hereinafter, the tiltable structure 12 may moreover be driven so as to carry out movements along a vertical axis Z, orthogonal to the horizontal plane XY.

The first rotation axis A1 represents a first median axis of symmetry for the microelectromechanical device 10; and the second rotation axis A2 represents a second median axis of symmetry for the same microelectromechanical device 10, which also has a central symmetry with respect to a center O (which moreover represents the center of the aforesaid tiltable structure 12).

Basically, the microelectromechanical device 10 may be divided into four quadrants with respect to the aforesaid center O, having a same arrangement and configuration.

The tiltable structure 12 is suspended above a cavity 13, obtained in the die, and has, in the embodiment illustrated, a generically circular shape in the horizontal plane XY. The tiltable structure 12 carries at the top a reflecting surface 12' so as to define a mirror structure.

The tiltable structure 12 is elastically coupled to a fixed structure 14, formed in the same die. In particular, the fixed structure 14 defines, in the horizontal plane XY, a frame 14' (in the example having a substantially squared shape), which delimits and surrounds the aforesaid cavity 13, and further comprises a supporting structure 15 (which will be described in greater detail hereinafter), which extends within the cavity 13 starting from the same frame 14'.

The tiltable structure 12 is elastically supported above the cavity 13 and is connected, in each quadrant, to a respective lever element 16. The lever element 16 extends, in the embodiment illustrated, in a diagonal direction, inclined at 45° with respect to the first and second horizontal axes x, y, starting from an edge portion of the tiltable structure 12, at a first end thereof, toward a vertex portion of the frame 14', at a second end thereof. In the embodiment illustrated, the lever element 16 has a substantially rectangular shape in the horizontal plane XY, elongated along the aforesaid diagonal direction.

In particular, the tiltable structure 12 is elastically coupled to each lever element 16, at its first end, by a respective elastic suspension element 18, having a high rigidity with regard to movements out of the horizontal plane XY (along the orthogonal axis Z, transverse to said horizontal plane XY) and furthermore configured so as to enable a relative rotation between the same tiltable structure 12 and the lever element 16.

In detail, each of the elastic suspension elements 18 comprises a first portion 18a of a folded type, connected to the aforesaid edge portion of the tiltable structure 12, and a second portion 18b, of a torsional type, formed by a rectilinear element arranged along the diagonal direction and connected between the first portion 18a and the first end of the lever element 16.

Each lever element 16, at its second end, is furthermore elastically coupled to the aforesaid supporting structure 15, in particular by respective elastic connecting elements 20, of a torsional type, having a rectilinear extension substantially transverse with respect to the aforesaid diagonal direction, on opposite sides with respect to the lever element 16, to define a lever rotation axis L for the lever element 16.

As will be discussed hereinafter, the lever element 16 is configured to rotate about the lever rotation axis L, so that its first end (coupled to the tiltable structure 12) moves upward along the vertical axis Z (and consequently its second end moves downward) or downward (and consequently its second end moves upward). In a corresponding manner, the tiltable structure 12 moves upward or downward at its edge portion coupled to the aforesaid first end of the lever rotation element 16.

In greater detail, the aforesaid supporting structure 15 comprises: central arms 15a, which extend starting from the frame 14' toward the tiltable structure 12, in the embodiment described, along the first rotation axis A1 or the second rotation axis A2, at the center with respect to the cavity 13, terminating at a distance from the same tiltable structure 12; and connecting arms 15b, having a first end elastically coupled to a respective lever element 16 by a respective elastic connecting element 20 and a second end fixed with respect to a respective central arm 15a, to which it is joined at the corresponding first rotation axis A1 or second rotation axis A2.

Consequently, in each quadrant of the microelectromechanical (MEMS) device 10, two connecting arms 15b are present, extending on opposite sides with respect to the corresponding lever element 16, toward a respective central arm 15a, which extends along the first and, respectively, the second rotation axis A1, A2.

The microelectromechanical device 10 further comprises an actuation structure 22, which is elastically coupled to the lever elements 16 and is configured to cause the movement of the tiltable structure 12, and in particular its rotation about the first rotation axis A1 or the second rotation axis A2 (or, as will be discussed hereinafter, its displacement along the vertical axis Z).

The actuation structure 22 comprises, in each quadrant in which it is possible to divide the microelectromechanical device 10: a first pair of driving arms 22a, arranged externally to the connecting arms 15b, between the same connecting arms 15b and the frame 14' (being separated therefrom by portions of the aforesaid cavity 13); and a second pair of driving arms 22b, arranged internally to the connecting arms 15b, between the same connecting arms 15b and a corresponding lever element 16 (being separated therefrom by further portions of the aforesaid cavity 13). In the embodiment illustrated, the driving arms 22a, 22b have a generically trapezoidal (or fin) shape in the horizontal plane XY.

Each driving arm 22a, 22b is suspended in cantilever fashion above the cavity 13 and carries, at a top surface thereof (opposite to the same cavity 13) a respective piezoelectric material region 23 (in particular of PZT—lead zirconate titanate), having substantially the same extension in the horizontal plane XY as the driving arm 22a, 22b (for example, and in a way not highlighted in the figures for simplicity, the piezoelectric material regions 23 may have a dimension smaller by approximately 30 μm for each side than the underlying driving arm 22a, 22b).

In a possible implementation, the driving arms 22a, 22b are shaped so as to provide substantially a same piezoelectric actuation area as a result of biasing of the respective piezoelectric material regions 23.

Each driving arm 22a, 22b has a respective first end fixedly coupled to a corresponding connecting arm 15b (and, therefore, fixed with respect to the frame 14') and a respective second end elastically coupled to the corresponding lever element 16.

In detail, the driving arms 22a of the first pair are elastically coupled to the corresponding lever element 16, at its second end (in the proximity of the frame 14'), by first elastic driving elements 24, which extend externally to the elastic connecting elements 20, between the same elastic connecting elements 20 and the frame 14; and the driving arms 22b of the second pair are elastically coupled to the corresponding lever element 16 by second elastic driving elements 25, which extend internally to the elastic connecting elements 20, between the same elastic connecting elements 20 and the tiltable structure 12.

The first and second elastic driving elements 24, 25 therefore extend on opposite sides of the elastic connecting elements 20 with respect to the lever rotation axis L and are each formed by a respective folded elastic element, having a high rigidity in regard to movements out of the horizontal plane XY (along the orthogonal axis Z) and being compliant to torsion (about a rotation axis parallel to their direction of extension, transverse to the corresponding lever element 16).

During operation, as on the other hand will be evident from an examination of FIG. 2, biasing (for example with a positive voltage difference ΔV) of the piezoelectric material regions 23 carried by the driving arms 22a of the first pair causes an upward displacement (along the vertical axis Z) of the respective second end elastically coupled to the corresponding lever element 16; this displacement is transmitted by the first elastic driving elements 24, thus causing upward displacement of the second end of the lever element 16 and rotation of the same lever element 16 about the lever rotation axis L, leading to a corresponding downward displacement of the first end and, therefore, of the coupled edge portion of the tiltable structure 12.

This rotation of the lever element 16 is not hindered—but rather enabled—by the second elastic driving elements 25 and occurs, for example, with a zero biasing (for example, with a zero-voltage difference ΔV) of the piezoelectric material regions 23 carried by the driving arms 22b of the second pair.

Likewise, biasing (for example, once again with a positive voltage difference ΔV) of the piezoelectric material regions 23 carried by the driving arms 22b of the second pair causes an upward displacement (along the vertical axis Z) of the respective second end elastically coupled to the corresponding lever element 16; this displacement is transmitted by the second elastic driving elements 25, thus causing upward displacement of the first end of the lever element 16 and rotation of the same lever element 16 about the lever rotation axis L, leading to a corresponding upward displacement of the second end and, therefore, of the coupled edge portion of the tiltable structure 12.

The above rotation of the lever element 16 is not hindered—but is rather enabled—in this case by the first elastic driving elements 24 and occurs, for example, with a zero biasing (for example, with a zero-voltage difference ΔV) of the piezoelectric material regions 23 carried by the driving arms 22a of the first pair.

In a possible embodiment, the piezoelectric material regions 23 of the driving arms 22a of the first pair in a given one of the quadrants into which the microelectromechanical device 20 is divided are electrically connected (in a manner not illustrated, by appropriate electrical connection elements) to the piezoelectric material regions 23 of the driving arms 22b of the second pair in the quadrant of the microelectromechanical device 10 arranged symmetrically with respect to the center O. Likewise, the piezoelectric material regions 23 of the driving arms 22b of the second pair in the given one of the quadrants into which the microelectromechanical device 10 is divided are electrically connected to the piezoelectric material regions 23 of the driving arms 22a of the first pair in the quadrant of the microelectromechanical device 10 arranged symmetrically with respect to the center O.

As a result of the aforesaid electrical connections, four sets of driving electrodes are obtained, which are represented schematically in FIG. 2 with different shades of grey, from the darkest to the lightest: Set1, Set2, Set3, and Set4. Biasing of the aforesaid sets of driving electrodes allows obtainment of desired rotations of the tiltable structure 12 about the first and second rotation axes A1, A2; in a possible non-limiting implementation, it is possible to obtain four different rotations of the tiltable structure 12 and four corresponding quasi-static driving positions.

In detail: application of the voltage difference ΔV, for example positive, to the driving electrodes of the sets Set2 and Set3, with zero biasing of the driving electrodes of the sets Set1 and Set4 leads to a negative rotation about the rotation axis A1; application of the voltage difference ΔV to the driving electrodes of the sets Set1 and Set4, with zero biasing of the driving electrodes of the sets Set2 and Set3 leads to a positive rotation about the same rotation axis A1; application of the voltage difference ΔV, for example once again positive, to the driving electrodes of the sets Set1 and Set3, with zero biasing of the driving electrodes of the sets Set2 and Set4 leads to a negative rotation about the rotation axis A2; and application of the voltage difference ΔV to the driving electrodes of the sets Set2 and Set4, with zero biasing of the driving electrodes of the sets Set1 and Set3 leads to a positive rotation about the same rotation axis A2.

Figure 3:
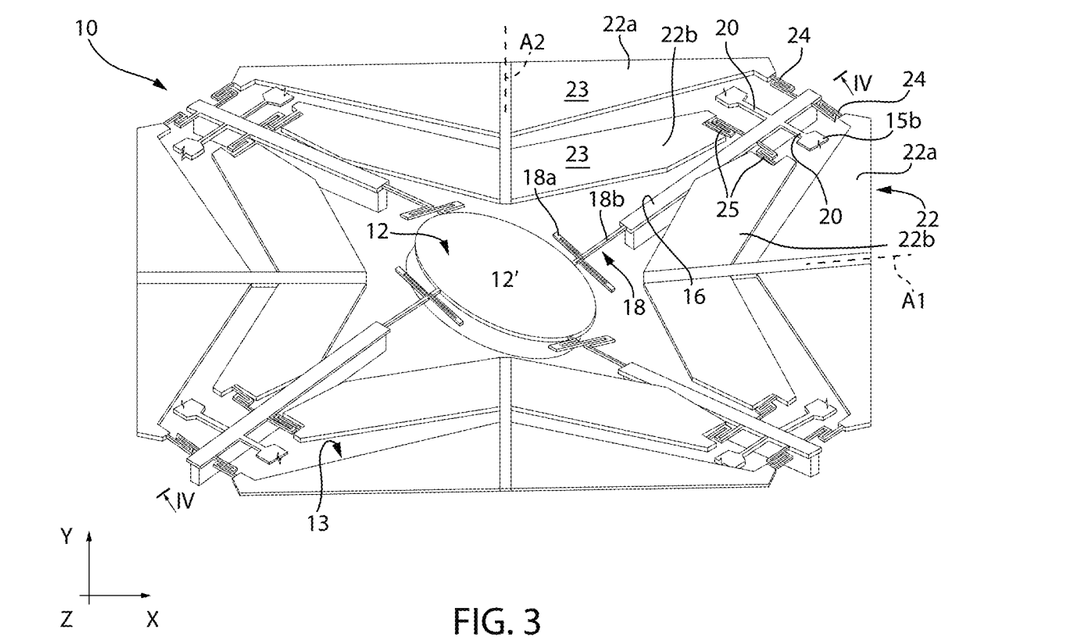
FIG. 3 is a perspective top view from above of the microelectromechanical device of FIG. 2 in the presence of a rotation movement of a corresponding tiltable structure.

By way of example, FIG. 3 shows the latter position of the tiltable structure 12, with positive rotation about the rotation axis A2, and moreover shows the deformation of the various elastic elements involved in the same rotation, as described in detail previously.

As mentioned, in different implementations, biasing of the four sets of driving electrodes may be such as to cause the tiltable structure 12 to assume desired positions within its range of movement.

Figure 4:
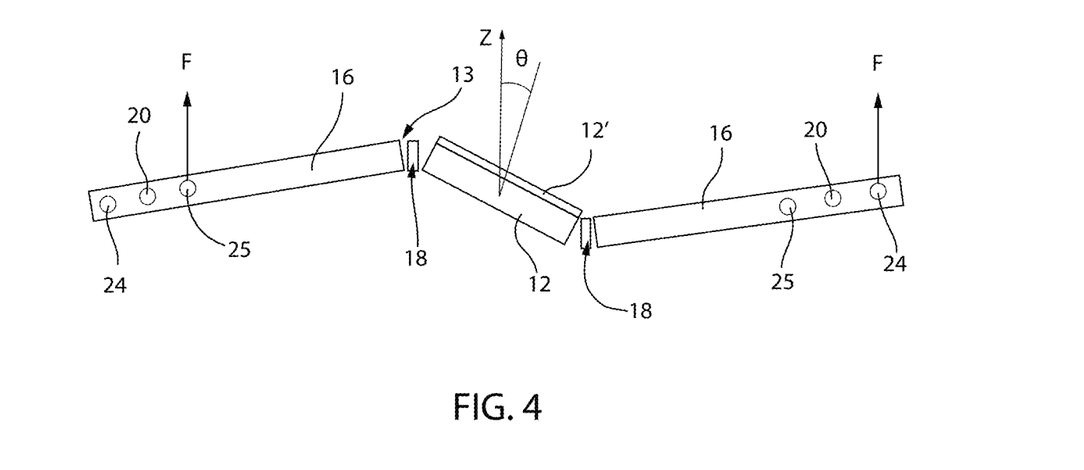
FIG. 4 is a schematic cross-sectional view of a portion of the microelectromechanical device of FIG. 3, executing the rotation movement.

FIG. 4 shows schematically, by way of example, the displacement of the microelectromechanical device 10, along a section IV-IV of FIG. 3, with a positive rotation about the rotation axis A2. In FIG. 4, F designates the driving force due to the piezoelectric effect acting at the points of coupling of the lever elements 16 with the respective elastic driving elements 24, 25 (which are, in fact, configured so as to transmit the force in the direction of the vertical axis Z to the aforesaid lever elements 16) causing the lever movement of the lever elements 16 about the lever rotation axis L; and θ designates the consequent angle of rotation of the tiltable structure 12 with respect to the vertical axis Z.

As shown schematically in the aforesaid FIG. 2, the microelectromechanical device 10 further comprises one or more piezoresistive (PZR) sensors 29, appropriately arranged so as to provide one or more detection signals associated to the rotation of the tiltable structure 12 about the first and second rotation axes A1, A2; these detection signal can be supplied as a feedback at the output from the microelectromechanical device 10 allowing implementing of an appropriate closed control loop.

The above piezoresistive sensors 29 are obtained (for example, by surface diffusion of dopant atoms) on one or more of the connecting arms 15b of the connecting structure 15 (different arrangements for the piezoresistive sensors 29 may, however, be envisaged). Advantageously, the elastic connecting elements 20 are able to transmit the stresses to the connecting arms 15b and therefore toward the piezoresistive sensors 29, thus enabling detection of the rotation of the tiltable structure 12.

In a manner not described in detail, but that will be evident, two arrangements of piezoresistive sensors 29 may be used, in a Wheatstone-bridge configuration, for detecting rotations of the tiltable structure 12 about the first and second rotation axes A1, A2 (and therefore the overall rotation of the tiltable structure 12).

Alternatively, as it is described in detail in the aforementioned document EP 3,666,727 A1, a mechanical amplification structure may moreover be introduced, designed to attempt to maximize, by an appropriate lever mechanism, the stress detected by the piezoresistive sensors 29 and, therefore, the corresponding sensitivity.

In a manner not illustrated, other types of detection of the rotations of the tiltable structure 12 may moreover be provided, for example by piezoelectric sensors.

Figure 5:
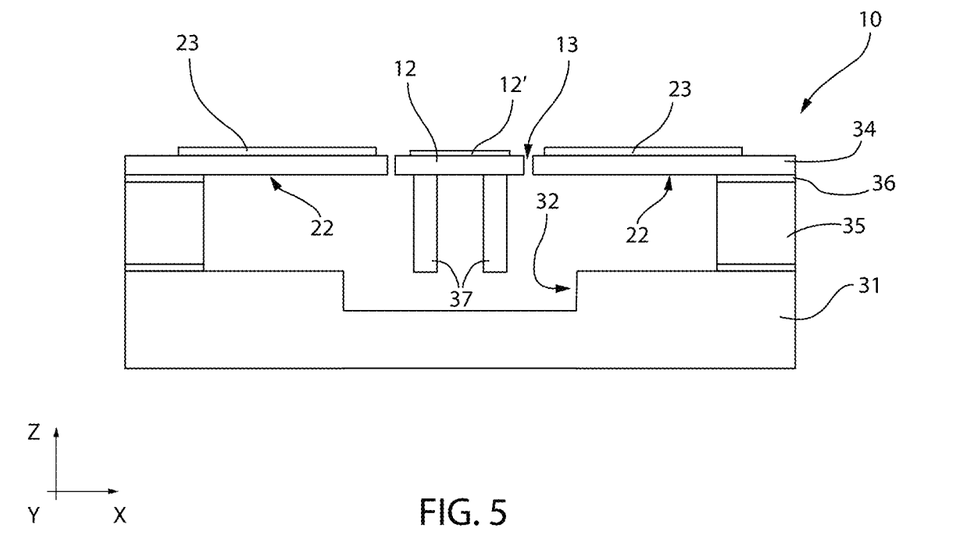
FIG. 5 is a schematic cross-sectional view of a possible implementation of the microelectromechanical device of FIG. 2, starting from a SOI (Silicon-On-Insulator) wafer.

FIG. 5 shows a simplified sectional view of the microelectromechanical device 10, where some elements are omitted for simplicity and others are represented schematically.

In particular, the above sectional view shows that the frame 14' is coupled at the bottom to a supporting wafer (the so-called "handling wafer") 31, which has, underneath the cavity 13 and the tiltable structure 12, a recess 32, for enabling rotation of the same tiltable structure 12.

In this embodiment, the tiltable structure 12, as likewise the actuation structure 22, is made in the active layer 34 of a SOI wafer, a supporting layer 35 of which, separated from the active layer 34 by a dielectric layer 36, is coupled at the bottom to the aforesaid handling wafer 31. The tiltable structure 12 moreover has at the bottom, in contact with the surface opposite to the reflecting surface 12', reinforcement elements 37, having extension along the vertical axis Z.

Figure 6:
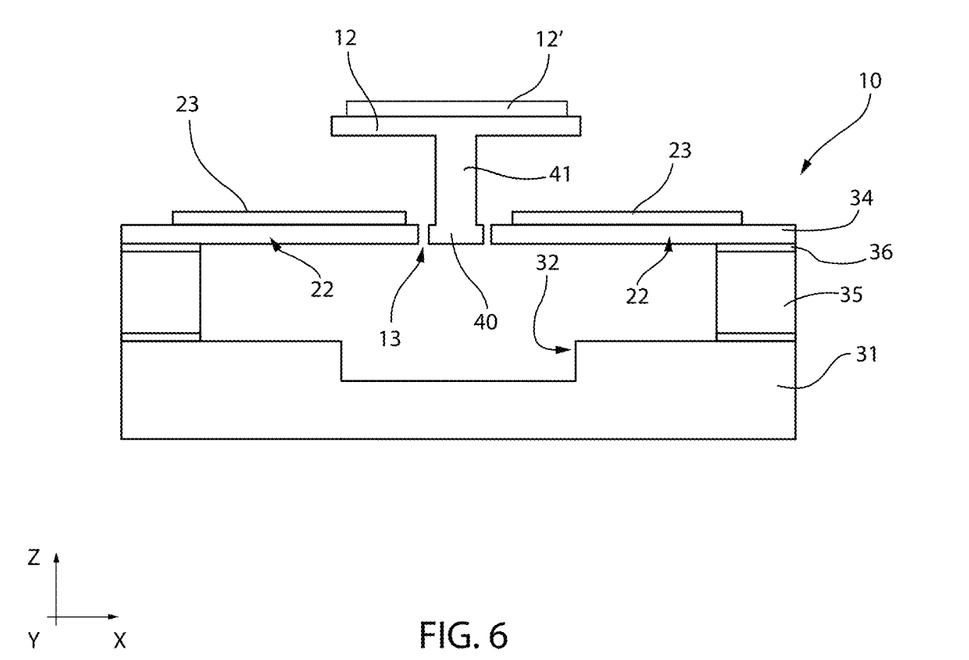
FIG. 6 is a cross-sectional view of a different embodiment of the microelectromechanical device.

As shown in FIG. 6, a possible variant embodiment envisages, instead, that the tiltable structure 12 is formed at a higher level with respect to the actuation structure 22, in a stacked manner. In particular, in this case the tiltable structure 12 is coupled in a stacked manner to a base portion 40, formed at the same level as the actuation structure 22 (separated from the latter by the cavity 13), by a connection pillar 41 having extension along the vertical axis Z. In this case, advantageously, an amplification of the lever effect implemented by the lever elements 16 (here not illustrated) is obtained, thus achieving a wider angle of inclination of the tiltable structure 12, with a more compact and sturdier solution.

The tiltable structure 12 is formed in this case in a different wafer of semiconductor material, which can be coupled to the base surface 40 for example by wafer bonding in front-end stages of the manufacturing process.

The advantages of this disclosure emerge clearly from the foregoing description.

In any case, it is highlighted that the described embodiments provide robust and efficient microelectromechanical mirror devices, in particular of the bi-dimensional vector-scanner type (the so-called MEMS vector scanners).

The embodiments described have a high linearity, wide angles of aperture for rotation of the mirror, and a compact structure.

Figure 7:
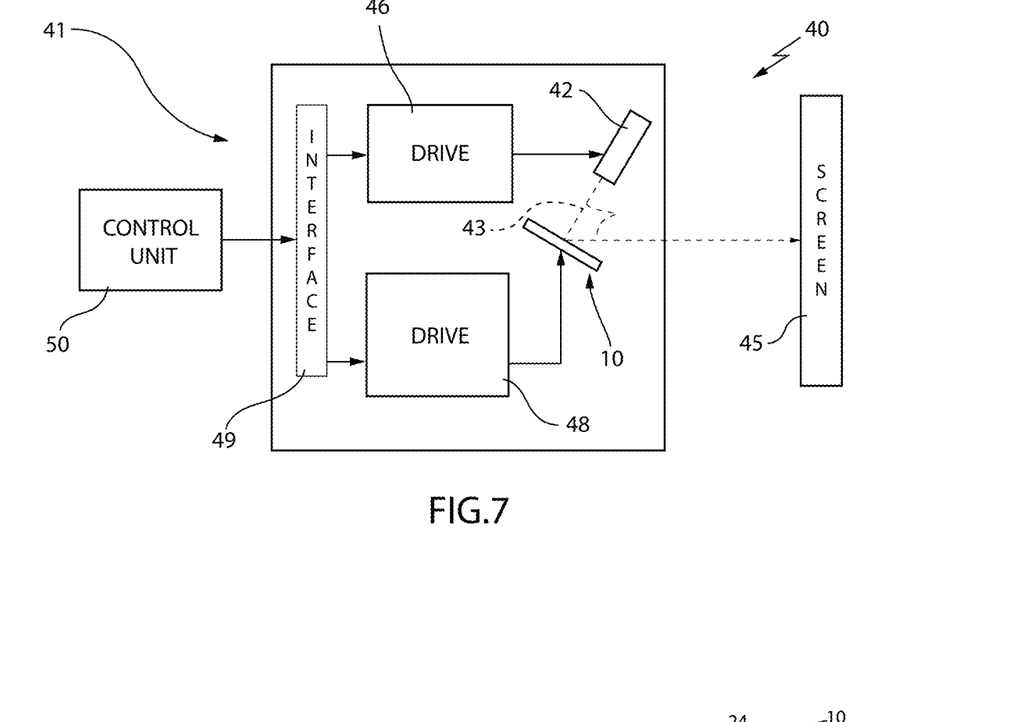
FIG. 7 is an overall block diagram of an electronic apparatus that uses the present microelectromechanical device.

For example, the microelectromechanical device 10 can be advantageously used in a projection apparatus 40 designed to be operatively coupled to a portable electronic apparatus 41, as illustrated schematically with reference to FIG. 7.

The projection apparatus 40 comprises a source 42, designed to generate an image 43; the microelectromechanical device 10, acting as mirror and designed to receive the image 43 and to direct it toward a screen 45 (external to, and set at a distance from, the same projection apparatus 40); a first driving circuit 46, designed to provide driving signals to the source 42, for generation of the image 43 to be projected; a second driving circuit 48, designed to supply driving signals to the actuation structure 22 of the microelectromechanical device 10; and a communication interface 49, designed to receive, from an external control unit 50, for example included in the portable electronic apparatus 41, information on the image to be projected, for example in the form of an array of pixels, which are sent at an input of the source 42 for driving it.

Finally, it is clear that modifications and variations may be made to what has been described and illustrated herein, without thereby departing from the scope of this disclosure.

In particular, the described embodiments and approaches can also be used to provide actuators for microelectromechanical speaker devices (the so-called μ-speakers), by varying the combination of biasing of the piezoelectric material regions 23 carried by the driving arms 22a, 22b of the first and second pairs.

In this case, the piezoelectric material regions 23 of the driving arms 22a of the first pairs are electrically connected together, and moreover the piezoelectric material regions 23 of the driving arms 22b of the second pairs are electrically connected together.

Figure 8:
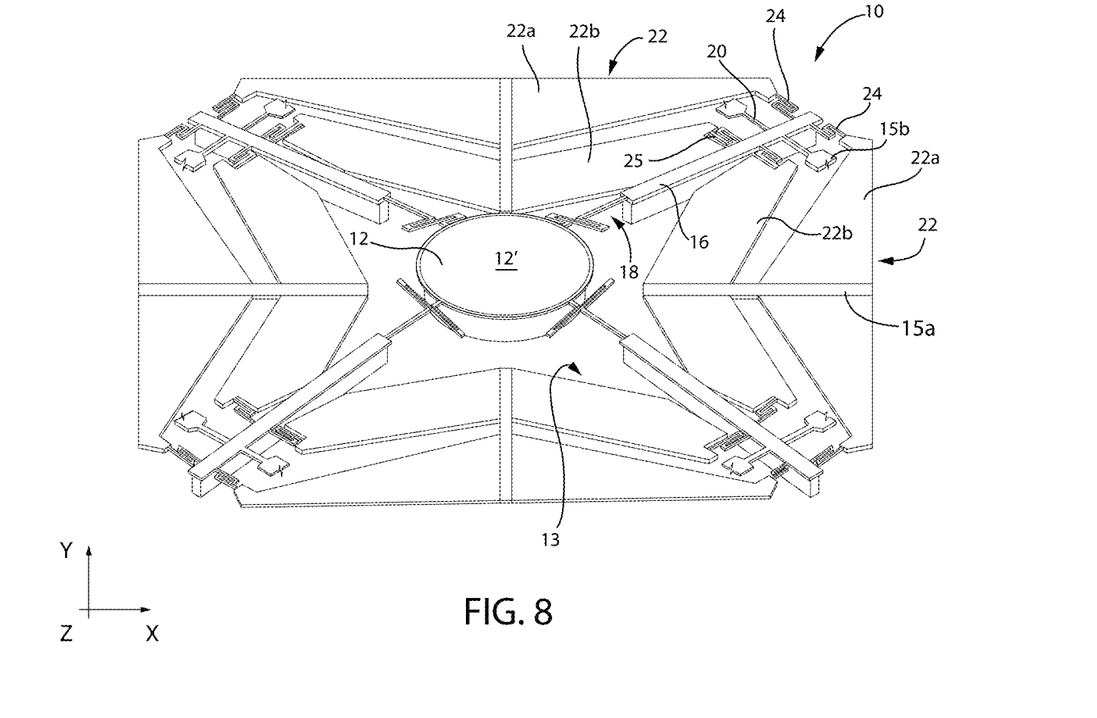
FIG. 8 is a schematic illustration of the microelectromechanical device of FIG. 2, in the presence of a vertical translation movement of a corresponding tiltable structure.

With reference to FIG. 8, by applying a same voltage difference ΔV, for example positive, to the driving electrodes 22b of the second pairs, with zero biasing of the driving electrodes 22a of the first pairs, an upward displacement along the vertical axis Z of the tiltable structure 12 is obtained. Likewise, by applying a same voltage difference ΔV to the driving electrodes 22a of the first pairs, with zero biasing of the driving electrodes 22b of the second pairs, a downward displacement along the vertical axis Z of the same tiltable structure 12 is obtained.

Basically, a piston-like displacement is achieved for the tiltable structure 12, which can thus be used as actuator, for example coupled to an appropriate deformable membrane (in a manner not illustrated), for generation of sound waves in a microelectromechanical speaker device.

Advantageously, this allows obtainment of vertical movements of the tiltable structure 12, with high linearity and excellent resistance to stress and shocks.

Furthermore, it is evident that variants may be envisaged regarding the shape and arrangement of the elements that form the microelectromechanical device 10, for example different shapes of the tiltable structure 12 (and of the corresponding reflecting surface 12').

Figure 9:
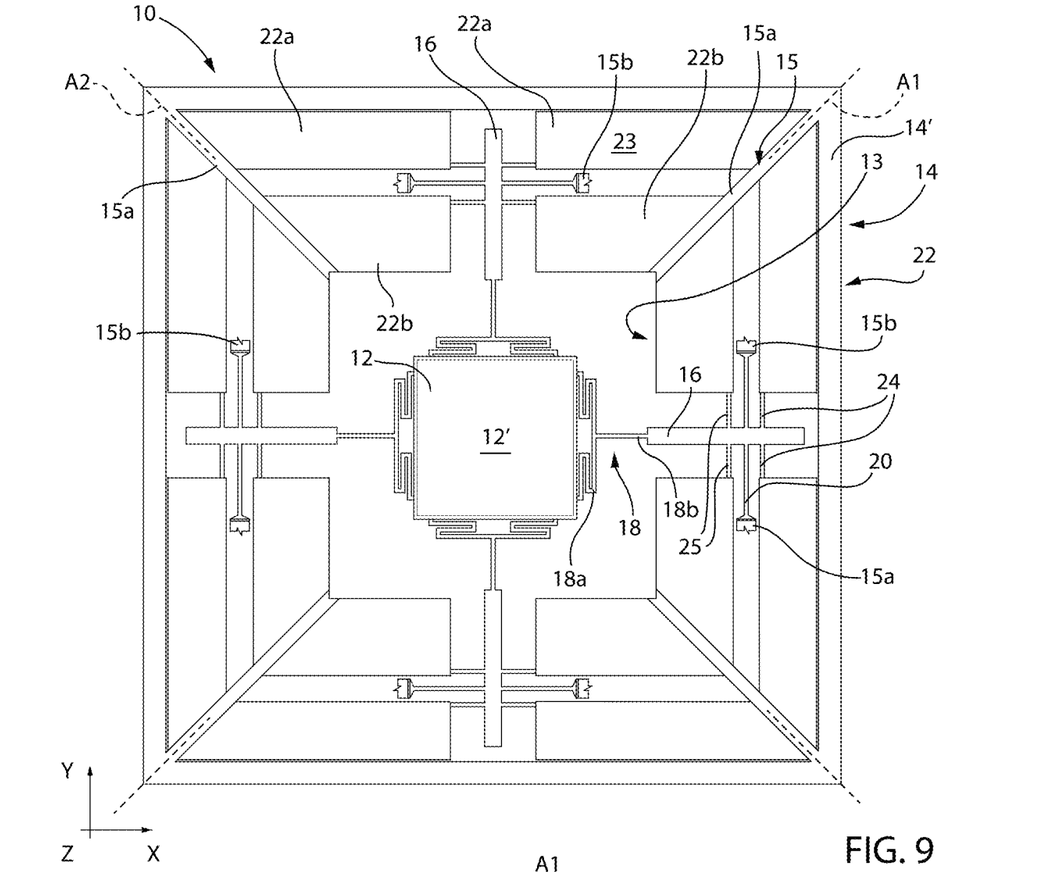
FIG. 9 is a top view of a microelectromechanical device according to a further embodiment.

In this regard, FIG. 9 shows a further embodiment of the microelectromechanical device 10, which differs from the one illustrated previously in that the rotation axes A1 and A2 are inclined by 45° with respect to the first and second horizontal axes x and y, i.e., to the sides of the frame 14' of the fixed structure 14 and of the corresponding die.

Consequently, the lever elements 16 are in this case aligned with the aforesaid horizontal axes x and y, whereas the central arms 15a of the supporting structure 15 are oriented along the diagonal directions (i.e., in this case, along the aforesaid rotation axes A1 and A2).

The tiltable structure 12 moreover has here a substantially square shape in the horizontal plane XY and the first portion 18a, once again of a folded type, of each of the elastic suspension elements 18 is doubled and connected to two end portions of a respective side of the tiltable structure 12.

In addition, in the embodiment illustrated, the first and second elastic decoupling elements 24, 25 have a linear and non-folded arrangement, being in each case rigid to movements out of the horizontal plane XY and compliant to rotation.

Otherwise, the configuration and operation of the microelectromechanical device 10 does not differ substantially from what has been discussed previously for the first embodiment.

Figure 10:
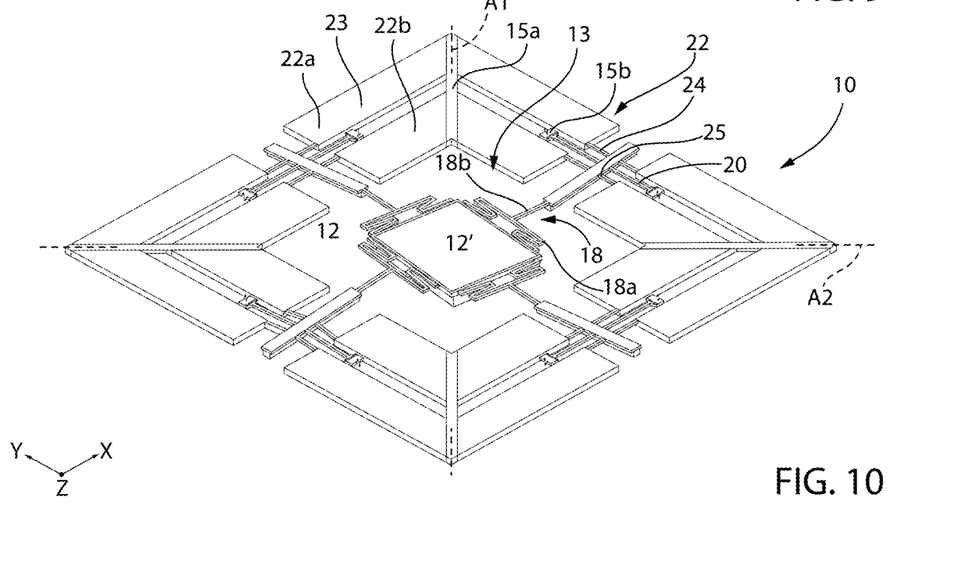
FIG. 10 is a perspective top view of the microelectromechanical device of FIG. 9 in the presence of a rotation movement of a corresponding tiltable structure.

By way of example, FIG. 10 shows a rotation of the tiltable structure 12 of the microelectromechanical device 10 of FIG. 9, which is a positive rotation about the first rotation axis A1, and moreover represents the deformation of the various elastic elements involved in the same rotation.

The invention claimed is:

1. A microelectromechanical device, comprising:
a fixed structure having a frame defining a cavity;
a tiltable structure elastically suspended above the cavity and having a main extension in a horizontal plane defined by a first horizontal axis and a second horizontal axis orthogonal to the first horizontal axis;
a piezoelectrically driven actuation structure configured to be biased to cause a desired rotation of the tiltable structure about a first rotation axis and a second rotation axis in said horizontal plane;
a supporting structure integral with the fixed structure and extending into the cavity starting from the frame; and
lever elements elastically coupled to the tiltable structure at a first end by respective elastic suspension elements and coupled to the supporting structure at a second end by elastic connecting elements which define a lever rotation axis;
wherein the lever elements are elastically coupled to the piezoelectrically driven actuation structure so that biasing of said piezoelectrically driven actuation structure causes, as a result of rotation of said lever elements about the lever rotation axis, the desired rotation of the tiltable structure about the first rotation axis and the second rotation axis, wherein said first and second rotation axes are inclined at 45° with respect to said first and second horizontal axes.

2. The microelectromechanical device according to claim 1, wherein said piezoelectrically driven actuation structure comprises, for each of said lever elements, a first pair of driving arms elastically coupled to the lever element by first elastic driving elements, and a second pair of driving arm elastically coupled to the lever element by second elastic driving elements on an opposite side of the lever rotation axis with respect to said first elastic driving elements.

3. The microelectromechanical device according to claim 2, wherein said first and second elastic driving elements are rigid with respect to movements out of the horizontal plane, along a vertical axis orthogonal to said horizontal plane, and compliant to torsion.

4. The microelectromechanical device according to claim 2, wherein said first and second pair of driving arms are suspended in cantilever fashion above the cavity, with a first end integrally coupled to said supporting structure and a second end elastically coupled to said lever elements; and wherein said driving arms carry a respective piezoelectric material region on a top surface thereof opposite to the cavity.

5. The microelectromechanical device according to claim 2, wherein said supporting structure comprises:
first arms, which extend starting from the frame towards the tiltable structure; and second arms, having a first end elastically coupled to a respective lever element by a respective elastic connecting element and having a second end integral with a respective one of said first arms;
wherein the driving arms of said first pair of driving arms are arranged externally to the second arms between said second arms and the frame; and
wherein the driving arms of said second pair of driving arms are arranged internally to said second arms between the second arms and a corresponding lever element.

6. The microelectromechanical device according to claim 2, wherein the microelectromechanical device has a central symmetry with respect to a center; and wherein said first rotation axis is a first axis of symmetry and the second rotation axis is a second axis of symmetry, said microelectromechanical device being consequently divided into four quadrants with respect to the center.

7. The microelectromechanical device according to claim 6, wherein the driving arms of the first pair of driving arms in a given quadrant are biased in a manner corresponding to the driving arms of the second pair of driving arms in the quadrant arranged symmetrically with respect to the center, and the driving arms of the second pair of driving arms in the given quadrant are biased in a manner corresponding to the driving arms of the first pair of driving arms in the quadrant arranged symmetrically with respect to the center; and wherein the driving arms of said first and second pairs of driving arms define four sets of driving electrodes designed to be biased to jointly define desired rotations of the tiltable structure about the first and second rotation axes.

8. The microelectromechanical device according to claim 7, wherein the four sets of driving electrodes are designed to be biased to define four different rotations of the tiltable structure and four corresponding quasi-static driving positions.

9. The microelectromechanical device according to claim 7, wherein the tiltable structure carries a mirror surface at a top, said microelectromechanical device providing a two-dimensional vector-scanner mirror device.

10. The microelectromechanical device according to claim 6, wherein the driving arms of the first pairs of driving arms in each quadrant are biased in a corresponding manner, and the driving arms of the second pairs of driving arms in each quadrant are biased in a respective corresponding manner; and wherein the driving arms of said first and second pairs of driving arms are designed to be biased to define linear movements of said tiltable structure along a vertical axis, orthogonal to said horizontal plane.

11. The microelectromechanical device according to claim 10, wherein said microelectromechanical device provides an actuator for a speaker device.

12. The microelectromechanical device according to claim 1, wherein said elastic suspension elements are rigid to movements out of the horizontal plane, along a vertical axis orthogonal to said horizontal plane, and are furthermore configured to enable a relative rotation between said tiltable structure and said lever elements.

13. The microelectromechanical device according to claim 12, wherein each of said elastic suspension elements comprises a first folded portion connected to an edge portion of the tiltable structure, and a second torsional portion connected between the first portion and the first end of a respective lever element.

14. The microelectromechanical device according to claim 1, wherein said tiltable structure is coupled by a connection pillar to a base portion formed at a same level as the piezoelectrically driven actuation structure and said supporting structure, said connection pillar having an extension along a vertical axis orthogonal to said horizontal plane.

15. The microelectromechanical device according to claim 1, wherein the elastic connecting elements comprise torsional elastic connecting elements.

16. A microelectromechanical device, comprising:
a fixed structure having a frame defining a cavity;
a tiltable structure elastically suspended above the cavity and having a main extension in a horizontal plane defined by a first horizontal axis and a second horizontal axis orthogonal to the first horizontal axis;
a piezoelectrically driven actuation structure configured to be biased to cause a desired rotation of the tiltable structure;
a supporting structure integral with the fixed structure and extending into the cavity starting from the frame; and
lever elements elastically coupled to the tiltable structure at a first end by respective elastic suspension elements and coupled to the supporting structure at a second end by elastic connecting elements;
wherein the lever elements are elastically coupled to the piezoelectrically driven actuation structure; and
wherein the piezoelectrically driven actuation structure is configured to be biased to cause a desired rotation of the tiltable structure about a first rotation axis and a second rotation axis in a horizontal plane, wherein said first and second rotation axes are inclined at 45° with respect to first and second horizontal axes.

17. The microelectromechanical device according to claim 16, wherein said piezoelectrically driven actuation structure comprises, for each of said lever elements, a first pair of driving arms elastically coupled to the lever element by first elastic driving elements, and a second pair of driving arms elastically coupled to the lever element by second elastic driving elements on an opposite side.

18. The microelectromechanical device according to claim 17, wherein said first and second elastic driving elements are rigid with respect to movements out of the horizontal plane and compliant to torsion.

19. The microelectromechanical device according to claim 17, wherein said first and second pair of driving arms are suspended in cantilever fashion above the cavity, with a first end integrally coupled to said supporting structure and a second end elastically coupled to said lever elements.

20. The microelectromechanical device according to claim 19, wherein said driving arms carry a respective piezoelectric material region on a top surface thereof opposite to the cavity.

* * * * *